(12) United States Patent
Sugioka et al.

(10) Patent No.: US 11,810,822 B2
(45) Date of Patent: Nov. 7, 2023

(54) APPARATUSES AND METHODS INCLUDING PATTERNS IN SCRIBE REGIONS OF SEMICONDUCTOR DEVICES

(71) Applicant: Micron Technology, Inc., Boise, ID (US)

(72) Inventors: Shigeru Sugioka, Hiroshima (JP); Keizo Kawakita, Hiroshima (JP); Raj K. Bansal, Boise, ID (US); Tsung Che Tsai, Tainan (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/481,489

(22) Filed: Sep. 22, 2021

(65) Prior Publication Data
US 2023/0090041 A1 Mar. 23, 2023

(51) Int. Cl.
*H01L 21/00* (2006.01)
*H01L 21/784* (2006.01)
*H01L 23/544* (2006.01)

(52) U.S. Cl.
CPC .......... *H01L 21/784* (2013.01); *H01L 23/544* (2013.01); *H01L 2223/5446* (2013.01)

(58) Field of Classification Search
CPC ..... H01L 21/78; H01L 21/782; H01L 21/784; H01L 2223/5446
See application file for complete search history.

(56) References Cited

U.S. PATENT DOCUMENTS

| 2013/0221353 | A1* | 8/2013 | Yang | H01L 22/34 257/E23.179 |
| 2016/0111360 | A1* | 4/2016 | Cho | H01L 21/76877 257/774 |
| 2021/0280466 | A1* | 9/2021 | Fujii | H01L 23/532 |
| 2021/0375779 | A1* | 12/2021 | Chou | H01L 21/76802 |

OTHER PUBLICATIONS

"The Hardness of Metals." https://www.sccboe.org/cms/lib/AL50000450/Centricity/Domain/779/the-hardness-of-metals-a-visual-representation-of-the-mohs-scale.pdf. (Year: 2022).*
Suzuki, Natsuki , et al., "High Throughput and Improved Edge Straightness for Memory Applications using Stealth Dicing", 2018 IEEE 68th Electronic Components and Technology Conference; accessed Nov. 28, 2021, Mar. 27, 2018.
Teh, Weng Hong, et al., "Multi-Strata Stealth Dicing Before Grinding for Singulation-Defects Elimination and Die Strength Enhancement: Experiment and Simulation", IEEE Transactions on Semiconductor Manufacturing, vol. 28, No. 3, Aug. 2015.

* cited by examiner

*Primary Examiner* — Reema Patel
(74) *Attorney, Agent, or Firm* — Dorsey & Whitney LLP

(57) ABSTRACT

Apparatuses including structures in scribe lines are described. An example apparatus includes: a first chip and a second chip; a scribe region between the first chip and the second chip; a crack guide region in the scribe region, the crack guide region including a dicing line along which the first chip and the second chip are to be divided; and a structure disposed in the crack guide region and extending along the dicing line.

16 Claims, 9 Drawing Sheets

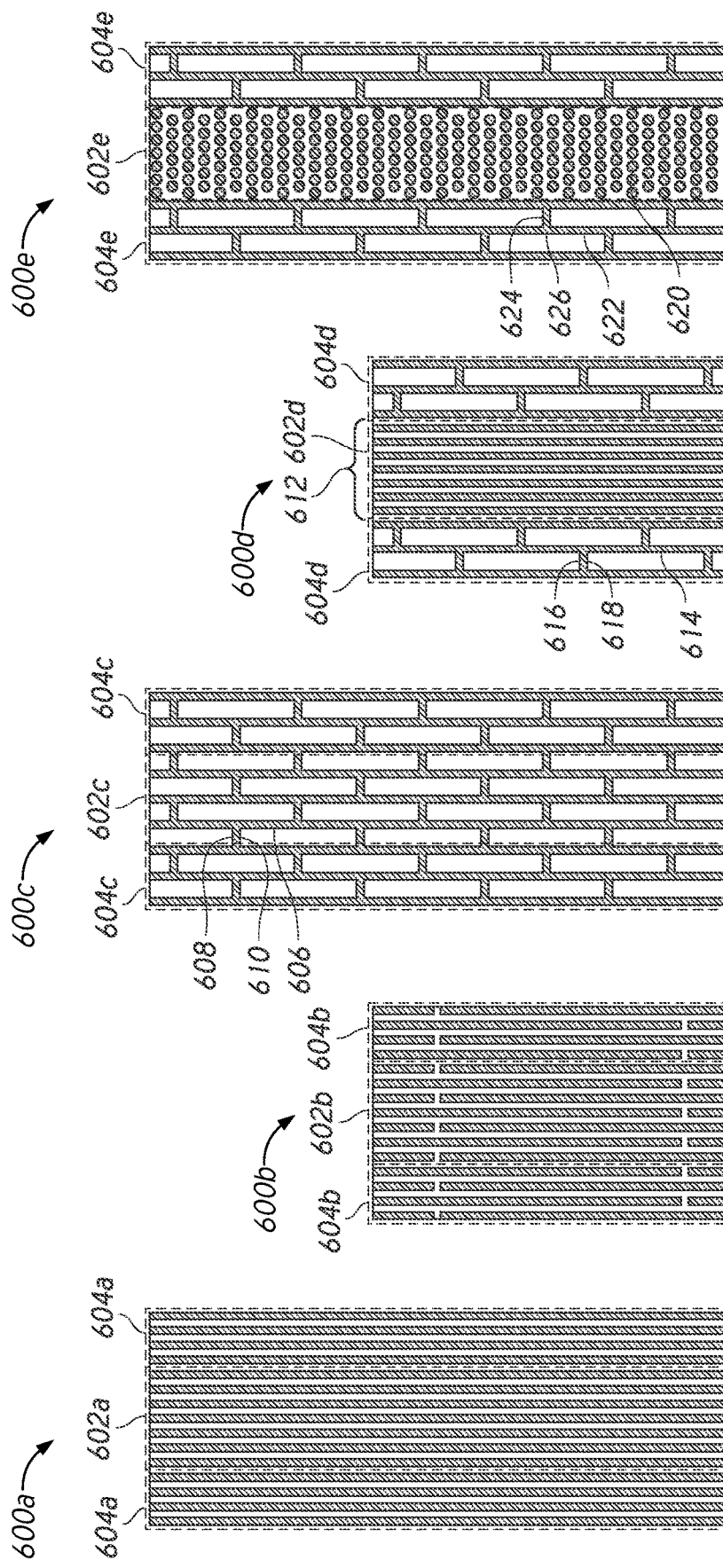

APPARATUSES AND METHODS INCLUDING PATTERNS IN SCRIBE REGIONS OF SEMICONDUCTOR DEVICES

BACKGROUND

High data reliability, high speed of memory access, lower power consumption and reduced chip size are features that are demanded from semiconductor memory. In recent years, some semiconductor devices include a low-k film of an insulating material, such as silicon oxycarbide (SiOC) and silicon carbonitride (SiCN), having a low dielectric constant (k) that exhibits weak electric polarization between conductive layers. The low-k film is included to reduce parasitic capacitance between the conductive layers and thus to achieve high-speed operations of electronic circuits in the semiconductor devices.

However, the low-k material has weak thermo-mechanical characteristics. For example, a low-k film has lower adhesion to its adjacent conductive layer or conductive components (e.g., interconnects) compared to a silicon dioxide (SiO2) film and a silicon nitride (Si3N4) film. Additionally, the low-k material is brittle. Once semiconductor elements are formed on a semiconductor wafer, the semiconductor wafer is diced into semiconductor chips. During the dicing process, cracks may be produced and such cracks may propagate through a film interface between the low-k film and another dielectric film (e.g., between SiO2 and SiOC films, between SiCN and SiO2 films, etc.). The cracks may reach an element formation region of the semiconductor device, which may result in a lower yield of the semiconductor devices.

In order to reduce the above cracks in the dicing process, a groove may be formed in a scribe region prior to dicing by etching through layers including the low-k film, which may increase fabrication complexity and cost, for example, include extra photo patterning and etching processes.

BRIEF DESCRIPTION OF THE DRAWINGS

FIG. 6A is a diagram for a layout of a scribe center region in accordance with one embodiment of the present disclosure.

FIG. 6B is a diagram for a layout of a scribe center region in accordance with one embodiment of the present disclosure.

FIG. 6C is a diagram for a layout of a scribe center region in accordance with one embodiment of the present disclosure.

FIG. 6D is a diagram for a layout of a scribe center region in accordance with one embodiment of the present disclosure.

FIG. 6E is a diagram for a layout of a scribe center region in accordance with one embodiment of the present disclosure.

DETAILED DESCRIPTION

Various embodiments of the present disclosure will be explained below in detail with reference to the accompanying drawings. The following detailed description refers to the accompanying drawings that show, by way of illustration, specific aspects in which embodiments of the present disclosure may be practiced. These embodiments are described in sufficient detail to enable those skilled in the art to practice the embodiments of present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
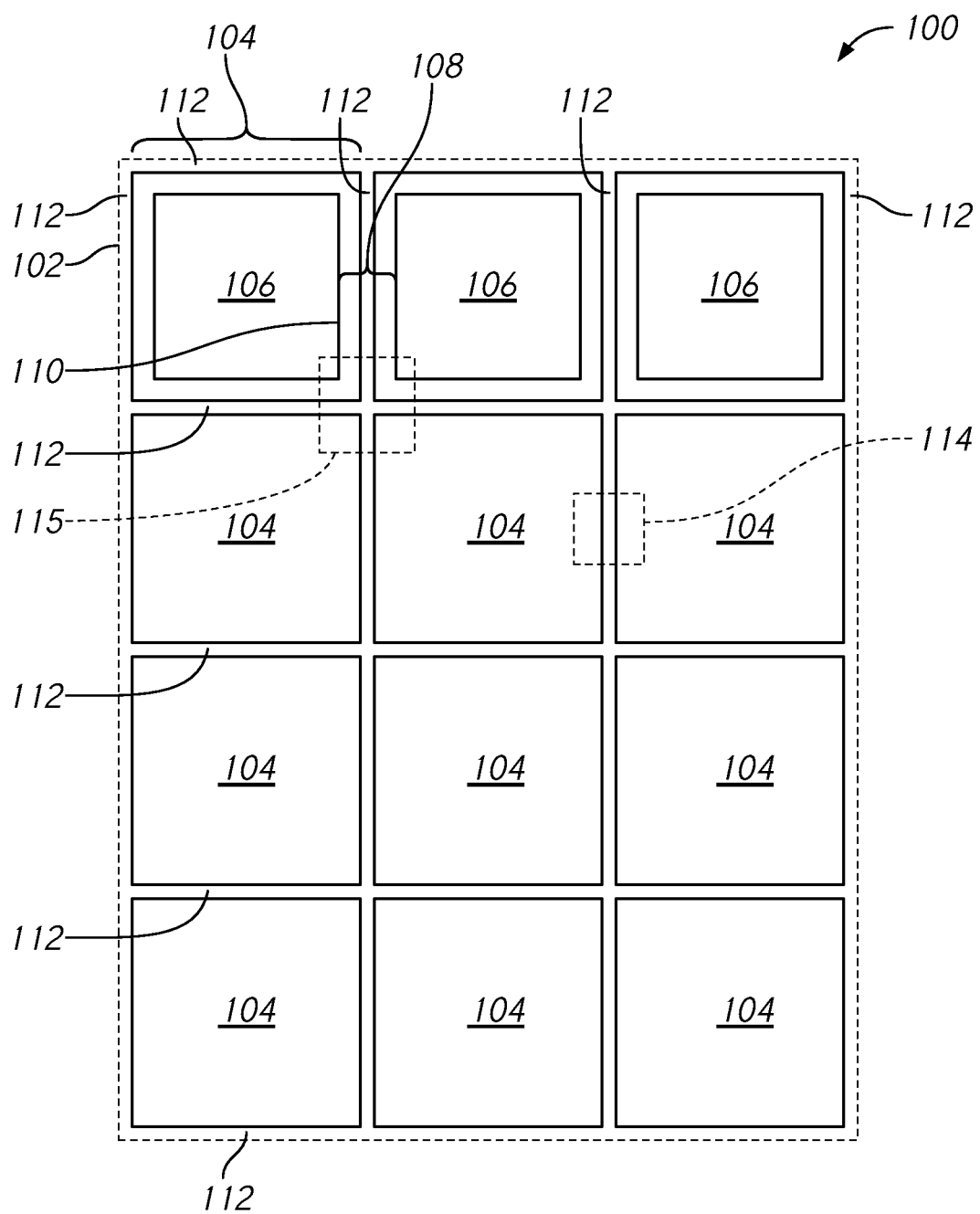
FIG. 1 is a diagram for a layout of a plurality of semiconductor chips included in a semiconductor wafer in accordance with an embodiment of the present disclosure.

FIG. 1 is a diagram for a layout of a plurality of semiconductor chips 104 included in a semiconductor wafer 100 in accordance with an embodiment of the present disclosure. FIG. 1 is a plan view illustrating a schematic configuration of a layout of a plurality of circuit regions 106 and scribe regions 108 formed on the semiconductor wafer device 100. The semiconductor wafer 100 may include a plurality of semiconductor chips 104. Each of the plurality of semiconductor chip 104 may include a corresponding circuit region 106 and a corresponding circuit edge 110 around the corresponding circuit region 106. In some embodiments, the circuit regions 106 may be disposed in a matrix and each circuit region 106 may have a rectangular shape. In each circuit region 106, transistors and circuit components, including conductive interconnects may be disposed. The transistors and the circuit components may include a plurality of memory cells, one or more circuits that provide memory access functions, such as read operations and write operations to the memory cells, and a control circuit that controls the circuits.

The scribe region 108 may be disposed around each circuit region 106. The scribe region 108 may include circuit edges 110 of adjacent chips 104 around adjacent circuit regions 106. In some embodiments, the scribe region 108 within each chip 104 (e.g., pad regions 206 of FIG. 2) may include a test element group (not shown) including test circuits. Each scribe region 108 may also include a scribe center region 112 between the adjacent circuit edges 110 of adjacent chips 104. In some embodiments, a dicing line may be defined in the scribe center region 112 for separating the semiconductor wafer 100 into individual semiconductor chips 104.

In some embodiments, separating the semiconductor wafer 100 in FIG. 1 into chips 104 may be performed by a dicing step. The dicing step may be performed along a dicing line in the scribe center region 112. In some embodiments, stealth laser dicing may be performed. In some embodiments, blade dicing may be performed. The semiconductor wafer 100 may include portions 114 and 115. The portion 114 may include adjacent semiconductor chips 104 and a scribe center region 112 between sides of the adjacent semiconductor chips 104. The portion 115 may include corners of adjacent semiconductor chips 104 and a scribe center region 112 between the corners of the adjacent semiconductor chips 104.

Figure 2:
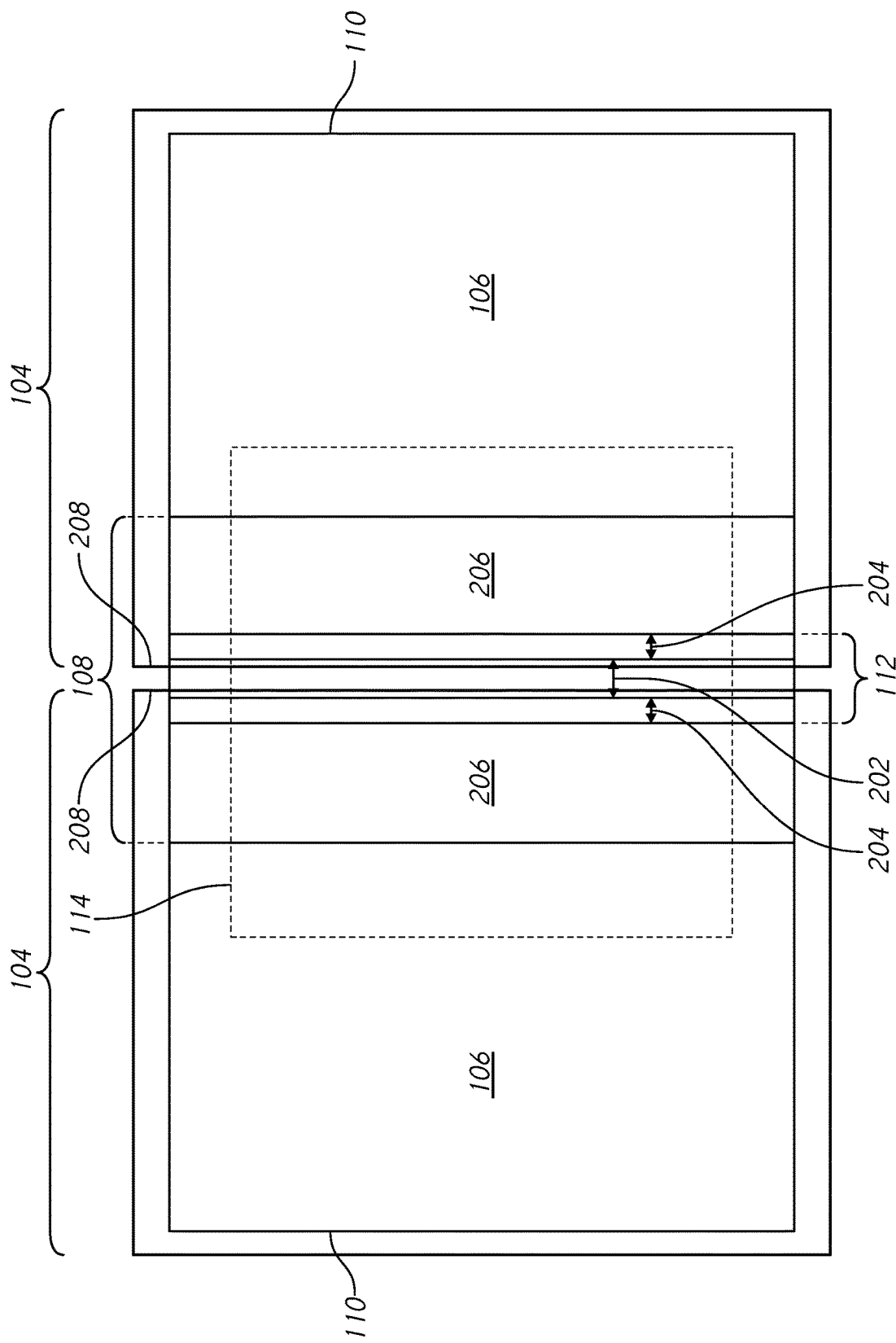
FIG. 2 is a diagram of a top view of adjacent semiconductor chips in accordance with an embodiment of the present disclosure.

FIG. 2 is a diagram of a top view of adjacent semiconductor chips 104 in accordance with an embodiment of the present disclosure. Each semiconductor chip 104 may include a circuit region 106 having a circuit edge 110 between the circuit region 106 and the scribe region 108. The scribe region 108 may include pad regions 206 provided adjacent to the circuit regions 106 of the chips 104. The pad regions 206 may include input/output terminals of the adjacent semiconductor chips 104. The pad regions 206 may also include the test circuits and test terminals and the test circuits in the scribe region 108 between the adjacent semiconductor chips. A scribe center region 112 may be disposed at the center of the scribe region 108. The scribe center region 112 may be disposed between the adjacent pad regions 206. The scribe center region 112 may include a crack guide region 202. In some embodiments, the crack guide region 202 may include a crack guide structure at the center of the scribe center region 112. The crack guide structure in the crack guide region 202 may guide excessive force due to dicing along the crack guide structure in the scribe center region 112, away from the chips 104. In some embodiments, the crack guide region 202 may have a width greater than a width of a laser beam used in stealth laser dicing. In some embodiments, the crack guide structure in the crack guide region 202 may collapse to absorb excessive force due to dicing. After dicing, each semiconductor chip 104 may have a side surface 208. Each semiconductor chip 104 may include a structure extending along the side surface 208. The structure extending along the side surface 208 may be a portion of the crack guide region 202. In some embodiments, each semiconductor chip 104 may include cracks along the structure along the side surface 208. In some embodiments, the structure along the side surface 208 may be collapsed.

The scribe center region 112 may also include crack mitigation regions 204 disposed on sides of the crack guide region 202. In some embodiments, the crack mitigation regions 204 may include crack mitigation structures. The crack mitigation structures in the crack mitigation regions 204 may help prevent excessive force caused by dicing from propagating to the chips 104 and generating cracks that reach the semiconductor chips 104. The crack mitigation structures in the crack mitigation regions 204 may be disposed outside the pad regions 206, and apart from the test terminals in the pad regions 206.

Figure 3:
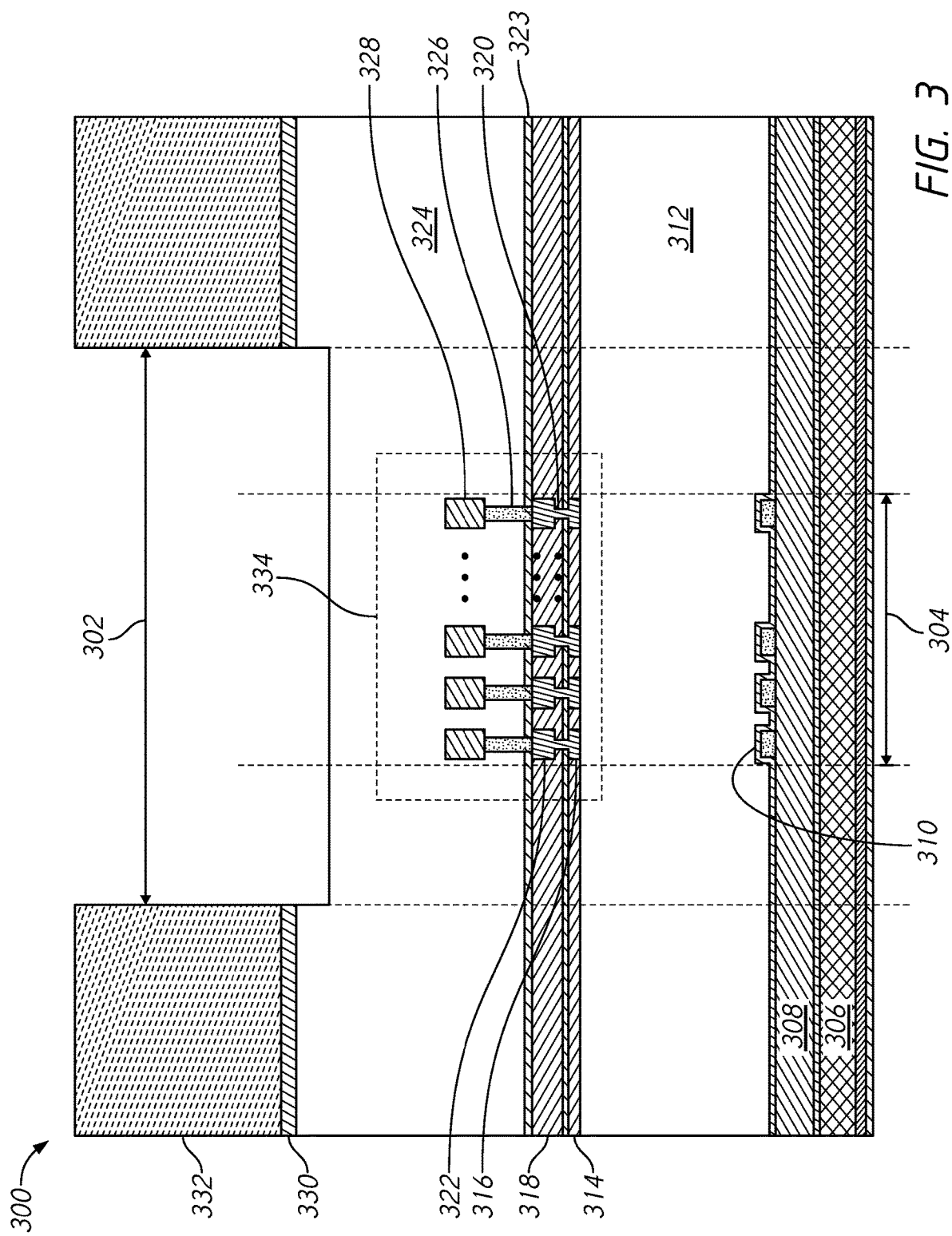
FIG. 3 is a vertical cross-sectional view of a portion including a scribe region and a scribe center region in accordance with one embodiment of the present disclosure.
Figure 4:
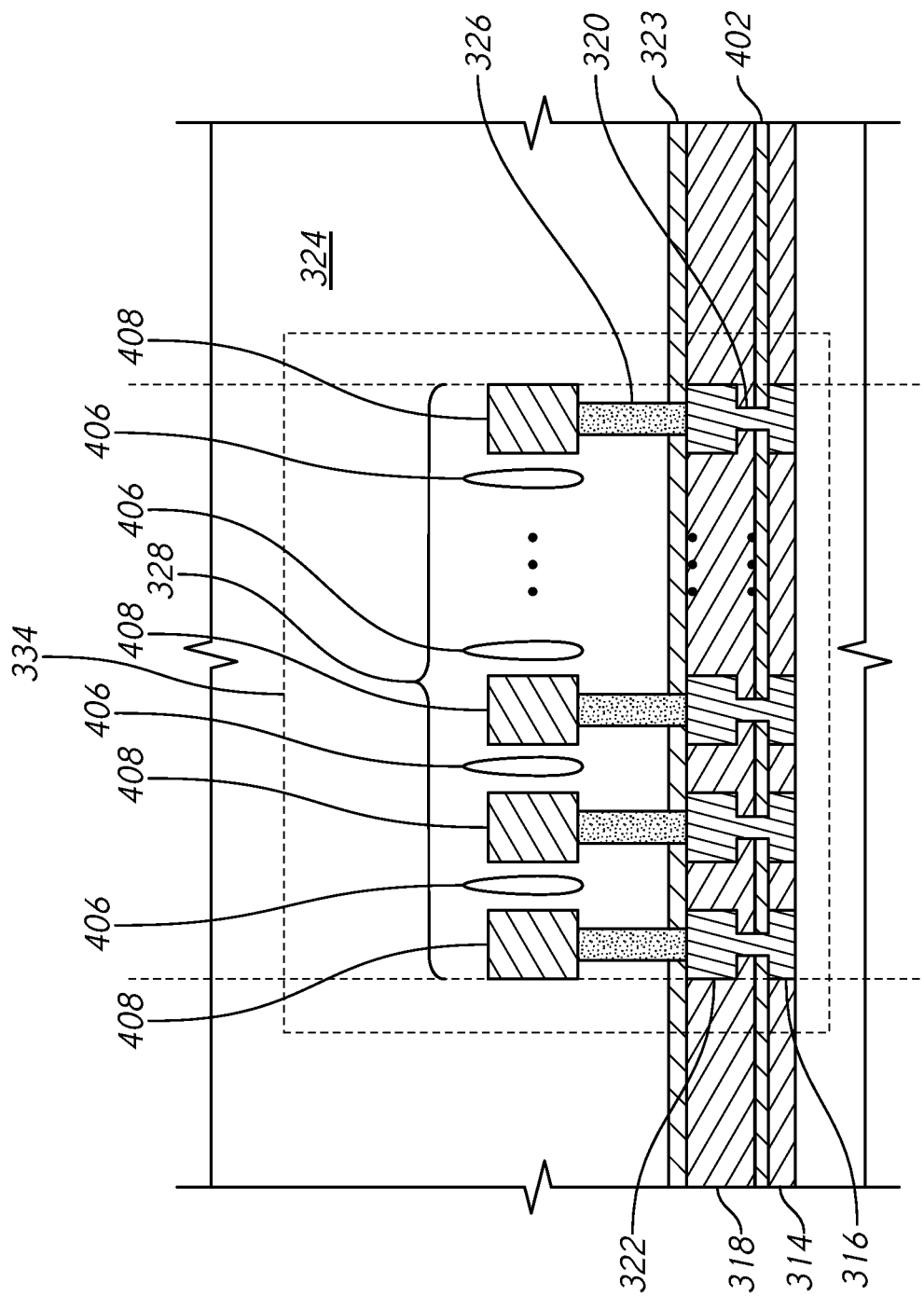
FIG. 4 is a vertical cross-sectional view of a structure in a scribe center region in accordance with one embodiment of the present disclosure.
Figure 5:
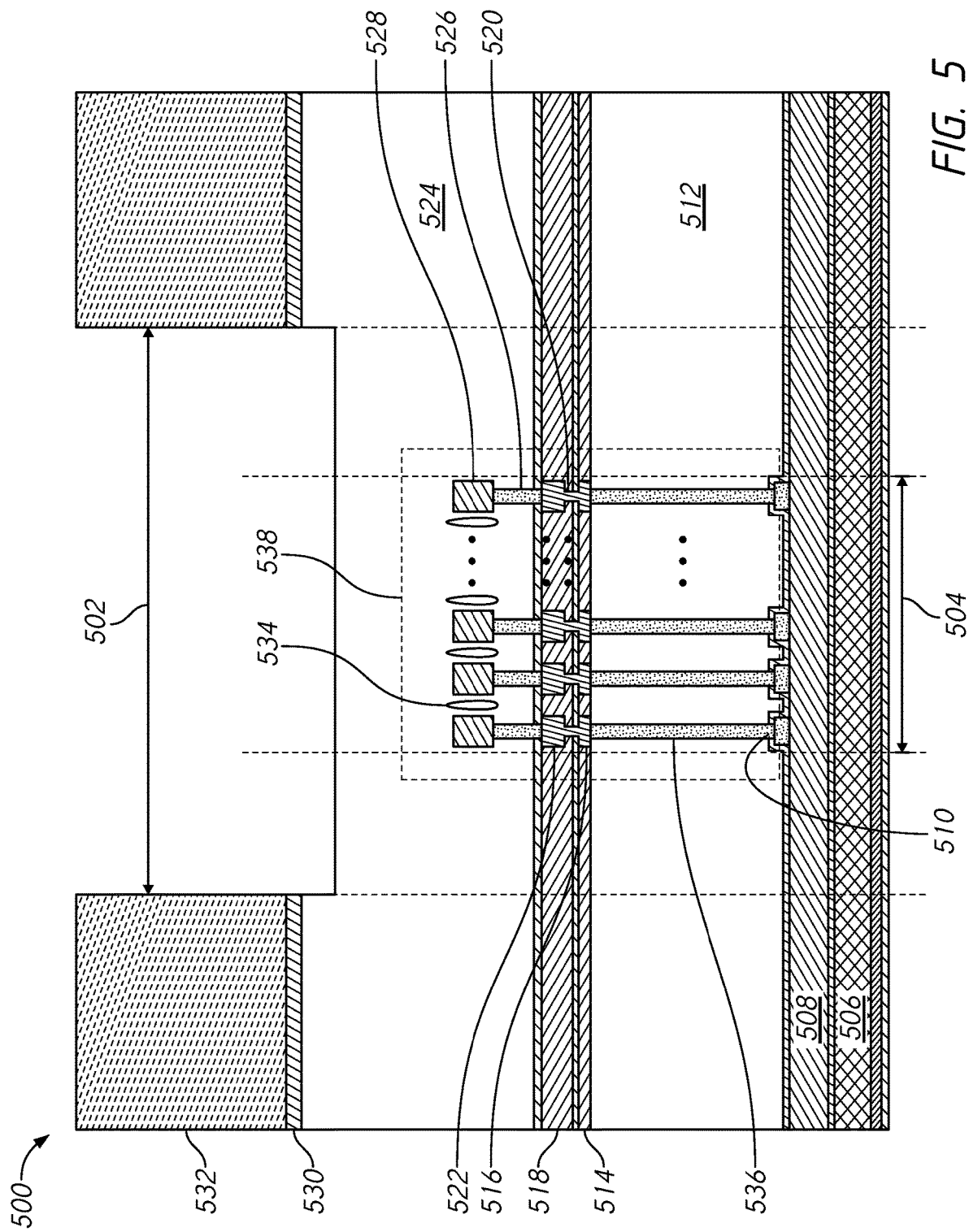
FIG. 5 is a vertical cross-sectional view of a portion including a scribe region and a scribe center region in accordance with one embodiment of the present disclosure.

In the following description of FIGS. 3-5, some embodiments include scribe regions including a crack guide structure and/or crack mitigation structures in a scribe center region as shown in FIGS. 3-5. However, each embodiment is not limited to one of these scribe regions.

FIG. 3 is a vertical cross-sectional view of a portion 300 including a scribe region 302 and a scribe center region 304 in accordance with one embodiment of the present disclosure. In some embodiments, the portion 300 may be included in the portion 114 in FIGS. 1 and 2, the scribe region 302 may be included in scribe region 108 in FIGS. 1 and 2, and the scribe center region 304 may be included in the scribe center region 112 in FIGS. 1 and 2.

The scribe region 302 may include a portion fabricated in a front-end-of-line (FEOL) above a substrate 306. The FEOL includes, for example, memory cells (not shown) disposed on the substrate 306 in a circuit region (e.g., circuit region 106 of FIG. 1). An insulating film 308 may be disposed on the substrate 102. In the scribe center region 304, lines 310 may be disposed on the insulating film 308. An insulating film 312 may be disposed above the lines 310 in the scribe center region 304. In some embodiments, the insulating film 312 may include dielectric material, for example, silicon dioxide (SiO2).

The scribe region 302 may include a portion fabricated in a back-end-of-line (BEOL) above the portion fabricated in the FEOL. The portion fabricated in the BEOL may include, for example, insulating films 314 and 318 above the insulating film 312. In some embodiments, the insulating films 314 and 318 may include material having a lower dielectric constant (k) (low-k material) than silicon dioxide (SiO2) that exhibits weak electric polarization between conductive layers. The low-k material may be included to prevent diffusion of a conductive material, such as copper (Cu), and to reduce parasitic capacitance between interconnects. Using the low-k material may help to achieve high-speed operations of electronic circuits in the semiconductor chips 104. In some embodiments, the low-k material may include silicon oxycarbide (SiOC), porous SiOC or silicon carbonitride (SiCN). While the scribe region 302 in FIG. 3 includes the insulating films 314 and 318, it will be appreciated that a number of insulating films and the location of the insulating films included in the BEOL may not be limited to the insulating films 314 and 318 previously described.

The scribe center region 304 in FIG. 3 may include a structure 334 in the BEOL. The structure 334 may include one or more structures (e.g., a crack guide structure in the crack guide crack guide region 202 and/or crack mitigation structures in the crack mitigation regions 204 of FIG. 2). In some embodiments, the structure 334 may include lines 316, 322 and 328. In some embodiments, the lines 316 may be disposed in the insulating film 314. In some embodiments, the lines 322 may be disposed in the insulating film 318. In some embodiments, there may be one or more vias 320 in the scribe center region 304. Each of the one or more vias 320 may have one end adjoining one of the lines 316 and another end adjoining one of the lines 322. In some embodiments, the one or more vias 320 may be disposed in the insulating film 318. A number of lines and the location of lines may not be limited to the lines 316 and 322. In some embodiments, forming the lines 316 may be performed by a single-Damascene process, and forming the vias 320 and the lines 322 may be performed by a dual-Damascene process. In some embodiments, the lines 316 and 322 and the vias 320 may include the same material. In some embodiments, the lines 316 and 322 and the vias 320 may include material that has hardness greater than hardness of material included in the insulating films 314 and 318. In some embodiments, the lines 316 and 322 may be included respectively in a first metal layer (M1) and a second metal layer (M2), each including metal in some embodiments. For example, the lines 316 and 322 may include copper (Cu). In some embodiments, one or more barrier films may be formed on surfaces of the lines 316 and 322 and the vias 320 in contact with the insulating films 314 and 318 during the Damascene processes. In some embodiments, the one or more barrier films may include transition metal or transition metal nitride. For example, the transition metal may be any one of, for example, yttrium (Y), titanium (Ti), zirconium (Zr), hafnium (Hf), niobium (Nb), or tantalum (Ta).

An insulating film 324 may be disposed above the insulating film 318. In some embodiments, the insulating film 324 may include silicon dioxide (SiO2). The lines 328 may be disposed in the insulating film 324. In some embodiments, there may be one or more vias 326 in the scribe center region 304. Each of the one or more vias 326 may have one end adjoining one of the lines 322 and another end adjoining one of the lines 328. In some embodiments, the one or more vias 326 may be disposed in the insulating film 324. A number of lines and the location of lines of top portions of the scribe center region 304 may not be limited to the lines 328 previously described. In some embodiment, the lines 328 may be included in a third metal layer (M3) including metal. In some embodiments, the lines 328 may include aluminum (Al). In some embodiments, the vias 326 may include tungsten (W).

The insulating film 324 outside the scribe region 302 may be covered by a passivation film 330. In some embodiments, the passivation film 330 may include silicon nitride (Si3N4). In some embodiments, a polyimide film 332 may be disposed as a mask above the passivation film 330. In some embodiments, the polyimide film 332 may include photopolymer material. A top surface of the insulating film 324 exposed through the passivation film 330 and polyimide film 332 may be etched to create an opening 333. In some embodiments, pad regions (e.g., the pad regions 206 of FIG. 2) may be disposed at a bottom of the opening 333 above the structure 334 and between adjacent chips (e.g., the chips 104).

FIG. 4 is a vertical cross-sectional view of a structure 334 in a scribe center region 304 in accordance with one embodiment of the present disclosure. The structure 334 may include the lines 316 in the insulating film 314, the lines 322 in the insulating film 318 and the lines 328 in the insulating film 324. The structure 334 may include vias 320 in the insulating film 318 and the vias 326 in the insulating film 324. In some embodiments, the lines 316 and 322 and the vias 320 and 326 may also include coating on surfaces in contact with any of the insulating films 314, 318 and 326.

In some embodiments, barrier films 402 and 323 may be disposed on the insulating films 314 and 318, respectively, to prevent diffusion of conductive material. The barrier films 402 and 323 may include so-called barrier low-k (BLOk) films to prevent diffusion of conductive material, such as copper (Cu). In some embodiments, the BLOk films may include material that has a lower dielectric constant (k) (low-k material) than silicon nitride (Si2N3-Si3N4) that exhibits weak electric polarization between conductive materials. The low-k material in the barrier films 402 and 323 may include, for example, nitrogen-doped silicon carbide (SiCN). In another embodiments, at least one of the barrier films 402 and 323 may include silicon nitride (Si3N4) that may improve adherence of the conductive material, regardless of their dielectric constant (k).

In some embodiments, the insulating films 314 and 318 may include material that has a lower dielectric constant (k) (low-k material) than silicon dioxide (SiO2) that exhibits weak electric polarization between conductive materials. The low-k material in the insulating films 314 and 318 may include, for example, carbon-doped silicon oxide (SiOC). The insulating films 314 and 318 including the carbon-doped silicon oxide (SiOC) may not prevent diffusion of conductive material, such as copper (Cu). Thus, in some embodiments, barrier films (not shown) that may prevent diffusion of the conductive material may be disposed on the insulating films 314 and 318. In some embodiments, the one or more barrier films may include transition metal or transition metal nitride. For example, the transition metal may be any one of, for example, yttrium (Y), titanium (Ti), zirconium (Zr), hafnium (Hf), niobium (Nb), or tantalum (Ta). The barrier films 402 and 404 may be disposed the barrier films including the transition metal or the nitride thereof.

In some embodiments, voids 406 may be optionally disposed between lines (e.g., wirings) 328. In some embodiments, void 406 between lines (e.g., wirings) 408 of the pattern 328 may not be included. In some embodiments, because voids 406 may be disposed at sides of the lines 328, the voids 406 may prevent excessive force caused by dicing from propagating to sides towards the chips 104 and generating cracks that reach the semiconductor chips 104.

FIG. 5 is a vertical cross-sectional view of a portion 500 including a scribe region 502 and a scribe center region 504 in accordance with one embodiment of the present disclosure. In some embodiments, the portion 500 may be the portion 114 in FIGS. 1 and 2, the scribe region 502 may be a scribe region 108 in FIGS. 1 and 2, and the scribe center region 504 may be the scribe center region 112 in FIGS. 1 and 2.

In some embodiments, the scribe region 502 may include a substrate 506 and an insulating film 508 on the substrate 506 in the FEOL, and insulating films 514, 518 and 524 in the BEOL, which are similar to the substrate 306 and the insulating film 308 in the FEOL, and the insulating films 314, 318 and 324 in the BEOL of FIG. 3, respectively. Thus, a detailed description of the substrate 506 and the insulating films 508, 514, 518 and 524 is omitted in the interest of brevity. In some embodiments, the portion 500 may include a structure 538 in the scribe center region 504. The structure 538 may include lines 516, 522 and 528, and vias 520 and 526, which are similar to the lines 316, 322 and 328, and the vias 320 and 326 of FIG. 3, respectively. In some embodiments, the scribe center region 504 may include voids 534 that are similar to the voids 406 of FIG. 4. In some embodiments, a passivation film 530 and a polyimide film 532 on the passivation film 530 outside the scribe region 502 may be similar to the passivation film 330 and the polyimide film 332. Thus, a detailed description of the lines 516, 522 and 528, the vias 520 and 526, the voids 534, the passivation film 530 and the polyimide film 532 is also omitted in the interest of brevity.

The structure 538 may include one or more vias 536 disposed in the insulating film 512. In some embodiments, each of the one or more vias 536 may have one end on one of lines 510 disposed on the insulating film 508 and another end on one of the lines 516. In some embodiments, the vias 536 may include material that has hardness greater than hardness of material included in the insulating film 512. In some embodiments, the vias 536 may include tungsten (W).

In the following description of FIGS. 6A-8, some embodiments include scribe center regions including a crack guide structure and/or crack mitigation structures as shown in FIGS. 6A-8. However, each embodiment is not limited to one of these scribe center regions.

FIG. 6A is a diagram for a layout of a scribe center region 600a in accordance with an embodiment of the present disclosure. In some embodiments, the scribe center region 600a may be the scribe center region 112 in FIGS. 1 and 2. The scribe center region 600a may include a crack guide region 602a including a crack guide structure at the center of the scribe center region 600a. The scribe center region 600a may also include crack mitigation regions 604a disposed on sides of the crack guide region 602a. In some embodiments, the crack mitigation regions 604a may include crack mitigation structures. The crack guide region 602a and the crack mitigation regions 604a may include any of the lines 316, 322, 328, 516, 522, 528 and/or any of the vias 320, 326, 520, 526, 536.

Structures in the crack guide region 602a and the crack mitigation regions 604a may include lines that may extend parallel to a dicing line (not shown). In some embodiments, the structures in the crack guide region 602a and the crack mitigation regions 604a may include material that has hardness greater than a hardness of an insulating film including the structures in the crack guide region 602a and the crack mitigation regions 604a. The crack guide structure in the crack guide region 602a may guide excessive force due to dicing to propagate along the lines in the scribe center region 600a, away from chips (e.g., the chips 104 in FIG. 1). In some embodiments, the crack guide region 602a may have a width greater than a width of a laser beam used in stealth laser dicing. In some embodiments, the crack guide structure in the crack guide region 602a may collapse to absorb excessive force due to dicing. The crack mitigation regions 604a may prevent excessive force caused by dicing from propagating to the chips and generating cracks that extend in the chips.

FIG. 6B is a diagram for a layout of a scribe center region 600b in accordance with an embodiment of the present disclosure. In some embodiments, the scribe center region 600b may be the scribe center region 112 in FIGS. 1 and 2. The scribe center region 600b may include a crack guide region 602b including a crack guide structure at the center of the scribe center region 600b. The scribe center region 600b may also include crack mitigation regions 604b disposed on sides of the crack guide region 602b. In some embodiments, the crack mitigation regions 604b may include crack mitigation structures. The crack guide region 602b and the crack mitigation regions 604b may include any of the lines 316, 322, 328, 516, 522, 528 and/or any of the vias 320, 326, 520, 526, 536.

Structures in the crack guide region 602b and the crack mitigation regions 604b may include line segments that may extend parallel to a dicing line (not shown). In some embodiments, line segments in the crack guide region 602b and the crack mitigation regions 604b are disposed in a staggered manner so that ends of adjacent line segments in parallel are not aligned. For example, respective ends of two adjacent line segments of the crack guide region 602b and the crack mitigation regions 604b are offset from one another. Excessive force guided by the adjacent line segments in the crack guide region 602b and the crack mitigation regions 604b may not be concentrated at the ends of the adjacent line segments and the excessive force may be dispersed. In some embodiments, the structures in the crack guide region 602b and the crack mitigation regions 604b may include material that has hardness greater than hardness of an insulating film including the structures in the crack guide region 602b and the crack mitigation regions 604b.

The crack guide structure in the crack guide region 602b may guide excessive force due to dicing to propagate along the line segments in the scribe center region 600b, away from chips (e.g., the chips 104 in FIG. 1). In some embodiments, the crack guide region 602b may have a width greater than a width of a laser beam used in stealth laser dicing. In some embodiments, the crack guide structure in the crack guide region 602b may collapse to absorb excessive force due to dicing. The crack mitigation regions 604b may prevent excessive force caused by dicing from propagating to the chips and generating cracks that extend in the chips.

FIG. 6C is a diagram for a layout of a scribe center region 600c in accordance with an embodiment of the present disclosure. In some embodiments, the scribe center region 600c may be the scribe center region 112 in FIGS. 1 and 2. The scribe center region 600c may include a crack guide region 602c including a crack guide structure at the center of the scribe center region 600c. The scribe center region 600c may also include crack mitigation regions 604c disposed on sides of the crack guide region 602c. In some embodiments, the crack mitigation regions 604c may include crack mitigation structures. Structures in the crack guide region 602c and the crack mitigation regions 604c may be included in any of the lines 316, 322, 328, 516, 522, 528 and/or any of the vias 320, 326, 520, 526, 536.

The crack guide region 602c and the crack mitigation regions 604c may include lines 606 that may extend parallel to a dicing line (not shown). The crack mitigation regions 604c may also include line segments 608 that may extend perpendicular to the lines 606. In some embodiments, the line segments 608 may be disposed in a staggered manner, so that one line 606 and one line segment 608 may be connected at each intersection 610, in other words, no two line segments 608 connected to one line 606 may be connected at a same intersection 610. Thus, excessive force guided by the adjacent lines 606 and adjacent line segments 608 in the crack guide region 602c and the crack mitigation regions 604c may not be concentrated at intersections 610 where one line 606 and one line segment 608 are connected, and the excessive force may be dispersed. In some embodiments, the structures in the crack guide region 602c and the crack mitigation regions 604c may include material that has hardness greater than hardness of an insulating film including the crack guide region 602c and the crack mitigation regions 604c.

The crack guide structure in the crack guide region 602c may guide excessive force due to dicing to propagate along the lines 606 in the scribe center region 600c, away from chips (e.g., the chips 104 in FIG. 1). In some embodiments, the crack guide region 602c may have a width greater than a width of a laser beam used in stealth laser dicing. In some embodiments, the crack guide structure in the crack guide region 602c may collapse to absorb excessive force due to dicing. The lines 606 in the crack mitigation regions 604c may guide excessive force caused by dicing in the direction parallel to the dicing line. The line segments 608 in the crack mitigation regions 604c may guide the excessive force in a direction towards the crack guide region 602c at the center of the scribe center region 600c, away from the chips. Thus, the crack mitigation regions 604c may prevent excessive force caused by dicing from propagating to the chips and generating cracks that extend in the chips.

FIG. 6D is a diagram for a layout of a scribe center region 600d in accordance with an embodiment of the present disclosure. In some embodiments, the scribe center region 600d may be the scribe center region 112 in FIGS. 1 and 2. The scribe center region 600d may include a crack guide region 602d including a crack guide structure at the center of the scribe center region 600d. The scribe center region 600d may also include crack mitigation regions 604d disposed on sides of the crack guide region 602d. In some embodiments, the crack mitigation regions 604d may include crack mitigation structures. The crack guide region 602d and the crack mitigation regions 604d may be included in any of the lines 316, 322, 328, 516, 522, 528 and/or any of the vias 320, 326, 520, 526, 536.

The crack guide region 602d may include lines 612 that may extend parallel to a dicing line (not shown). The crack mitigation regions 604d may include lines 614 that may extend parallel to the dicing line (not shown). The crack mitigation regions 604d may also include line segments 616 that may extend perpendicular to the lines 614. In some embodiments, the line segments 616 may be disposed in a staggered manner, so that one line 614 and one line segment 616 may be connected at each intersection 618, in other words, no two line segments 616 connected to one line 614 may be connected at a same intersection 618. Thus, excessive force guided by the adjacent lines 614 and adjacent line segments 616 in the crack mitigation regions 604d may not be concentrated at intersections 618 where one line 614 and one line segment 616 are connected, and the excessive force may be scattered. In some embodiments, the crack guide region 602d and the crack mitigation regions 604d may include material that has hardness greater than hardness of an insulating film including the crack guide region 602d and the crack mitigation regions 604d.

The crack guide structure in the crack guide region 602d may guide excessive force due to dicing to propagate along the lines 612 in the scribe center region 600d, away from chips (e.g., the chips 104 in FIG. 1). In some embodiments, the crack guide region 602d may have a width greater than a width of a laser beam used in stealth laser dicing. In some embodiments, the crack guide structure in the crack guide region 602d may collapse to absorb excessive force due to dicing. The lines 614 in the crack mitigation regions 604d may guide excessive force caused by dicing in the direction parallel to the dicing line. The line segments 616 in the crack mitigation regions 604d may guide the excessive force in a direction towards the crack guide region 602d at the center of the scribe center region 600d, away from the chips. Thus, the crack mitigation regions 604d may prevent excessive force caused by dicing from propagating to the chips and generating cracks that extend in the chips.

FIG. 6E is a diagram for a layout of a scribe center region 600e in accordance with an embodiment of the present disclosure. In some embodiments, the scribe center region 600e may be the scribe center region 112 in FIGS. 1 and 2. The scribe center region 600e may include a crack guide region 602e including a crack guide structure at the center of the scribe center region 600e. The scribe center region 600e may also include crack mitigation regions 604e disposed on sides of the crack guide region 602e. In some embodiments, the crack mitigation regions 604e may include crack mitigation structures. The crack guide region 602e and the crack mitigation regions 604e may be included in any of the lines 316, 322, 328, 516, 522, 528 and/or any of the vias 320, 326, 520, 526, 536.

The crack guide region 602e may include vias 620 that may extend in a direction of dicing through layers perpendicular to each insulating film (e.g., the insulating films 314, 318, 324, 514, 518, 524) in a semiconductor device (e.g., the semiconductor device 100). The crack mitigation regions 604e may include lines 622 that may extend parallel to the dicing line (not shown). The crack mitigation regions 604e may also include line segments 624 that may extend perpendicular to the lines 622. In some embodiments, the line segments 624 may be disposed in a staggered manner, so that one line 622 and one line segment 624 may be connected at each intersection 626, in other words, no two line segments 624 connected to one line 622 may be connected at a same intersection 626. Thus, excessive force guided by the adjacent lines 622 and adjacent line segments 624 in the crack mitigation regions 604e may not be concentrated at intersections 626 where one line 622 and one line segment 624 are connected, and the excessive force may be dispersed. In some embodiments, the crack guide region 602e and the crack mitigation regions 604e may include material that has hardness greater than hardness of an insulating film including the crack guide region 602e and the crack mitigation regions 604e.

The crack guide structure in the crack guide region 602e may guide excessive force due to dicing to propagate in the dicing direction along the vias 620 in the scribe center region 600e, away from chips (e.g., the chips 104 in FIG. 1). In some embodiments, the crack guide region 602e may have a width greater than a width of a laser beam used in stealth laser dicing. In some embodiments, the crack guide structure in the crack guide region 602e may collapse to absorb excessive force due to dicing. The lines 622 in the crack mitigation regions 604e may guide excessive force caused by dicing in the direction parallel to the dicing line. The line segments 624 in the crack mitigation regions 604e may guide the excessive force in a direction towards the crack guide region 602e at the center of the scribe center region 600e, away from the chips. Thus, the crack mitigation regions 604e may prevent excessive force caused by dicing from propagating to the chips and generating cracks that extend in the chips.

Figure 6G:
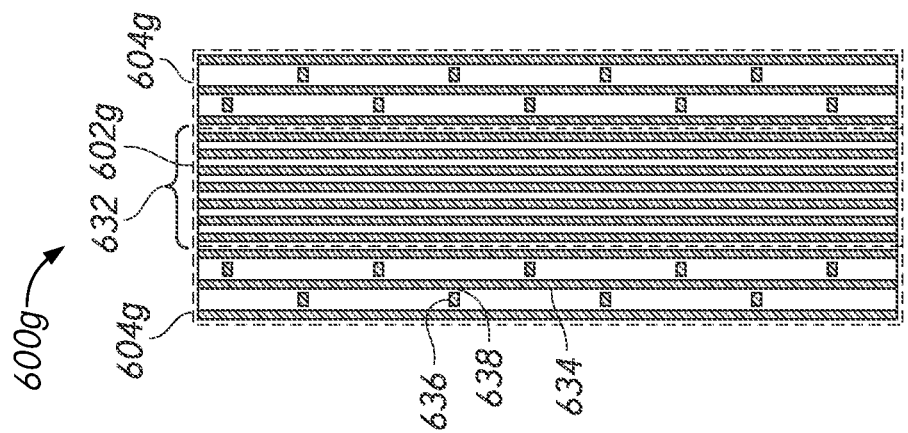
FIG. 6G is a diagram for a layout of a scribe center region in accordance with one embodiment of the present disclosure.
Figure 6F:
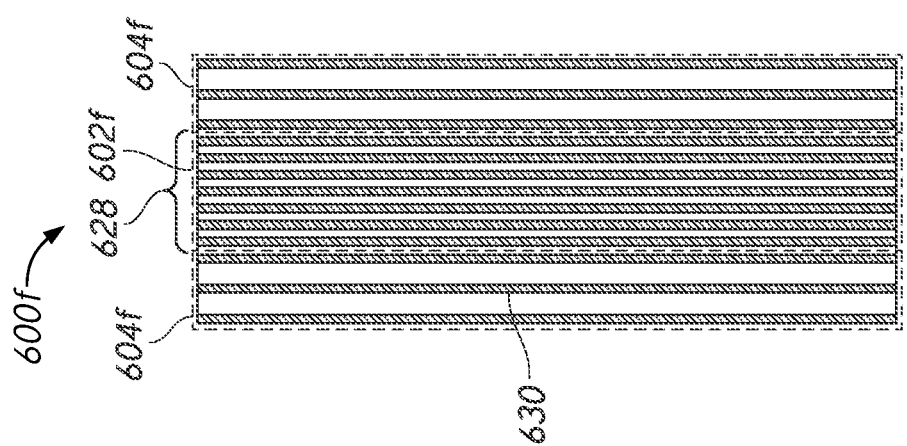
FIG. 6F is a diagram for a layout of a scribe center region in accordance with one embodiment of the present disclosure.

FIG. 6F is a diagram for a layout of a scribe center region 600f in accordance with an embodiment of the present disclosure. In some embodiments, the scribe center region 600f may be the scribe center region 112 in FIGS. 1 and 2. The scribe center region 600d may include a crack guide region 602f including a crack guide structure at the center of the scribe center region 600f. The scribe center region 600f may also include crack mitigation regions 604f disposed on sides of the crack guide region 602f. In some embodiments, the crack mitigation regions 604f may include crack mitigation structures. The crack guide region 602f and the crack mitigation regions 604f may be included in any of the lines 316, 322, 328, 516, 522, 528 and/or any of the vias 320, 326, 520, 526, 536.

The crack guide region 602f may include lines 628 that may extend parallel to a dicing line (not shown). The crack mitigation regions 604f may include lines 630 that may extend parallel to the dicing line (not shown). The lines 630 may be disposed with wider intervals than intervals of the lines 628. In some embodiments, the crack guide region 602f and the crack mitigation regions 604f may include material that has hardness greater than hardness of an insulating film including the crack guide region 602f and the crack mitigation regions 602f and 604f.

The crack guide structure in the crack guide region 602f may guide excessive force due to dicing to propagate along the lines 628 in the scribe center region 600f, away from chips (e.g., the chips 104 in FIG. 1). In some embodiments, the crack guide region 602f may have a width greater than a width of a laser beam used in stealth laser dicing. In some embodiments, the crack guide structure in the crack guide region 602f may collapse to absorb excessive force due to dicing. The lines 628 in the crack mitigation regions 604f may guide excessive force caused by dicing in the direction parallel to a dicing line. Dielectric material in the wider interval between the lines 628 may block the excessive force. Thus, the crack mitigation regions 604f may prevent excessive force caused by dicing from propagating to the chips and generating cracks that extend in the chips.

FIG. 6G is a diagram for a layout of a scribe center region 600g in accordance with an embodiment of the present disclosure. In some embodiments, the scribe center region 600g may be the scribe center region 112 in FIGS. 1 and 2. The scribe center region 600g may include a crack guide region 602g including a crack guide structure at the center of the scribe center region 600g. The scribe center region 600g may also include crack mitigation regions 604g disposed on sides of the crack guide region 602g. In some embodiments, the crack mitigation regions 604g may include crack mitigation structures. The crack guide region 602f and the crack mitigation regions 604g may be included in any of the lines 316, 322, 328, 516, 522, 528 and/or any of the vias 320, 326, 520, 526, 536.

The crack guide region 602g may include lines 632 that may extend parallel to a dicing line (not shown). The crack mitigation regions 604g may include lines 634 that may extend parallel to the dicing line (not shown). The crack mitigation regions 604g may also include line segments 636 that may extend perpendicular to the lines 634. In some embodiments, the line segments 636 may be disposed in a staggered manner. A line segment 636 may be spaced apart from an adjacent line 634 at a point 638 on the adjacent line 634 in proximity to an end of the line segment 636. In other words, no line segment 636 is connected to adjacent lines 634. Thus, excessive force guided by the line segment 636 in the crack mitigation regions 604g may not be concentrated at any points 638, and the excessive force may be dispersed on the adjacent line 634. In some embodiments, the crack guide region 602g and the crack mitigation regions 604g may include material that has hardness greater than hardness of an insulating film including the crack guide region 602g and the crack mitigation regions 604g.

The crack guide structure in the crack guide region 602g may guide excessive force due to dicing to propagate along the lines 632 in the scribe center region 600g, away from chips (e.g., the chips 104 in FIG. 1). In some embodiments, the crack guide region 602g may have a width greater than a width of a laser beam used in stealth laser dicing. In some embodiments, the crack guide structure in the crack guide region 602g may collapse to absorb excessive force due to dicing. The lines 634 in the crack mitigation regions 604g may guide excessive force caused by dicing in the direction parallel to the dicing line. The line segments 636 in the crack mitigation regions 604g may guide the excessive force in a direction towards the crack guide region 602g at the center of the scribe center region 600g, away from the chips. Thus, the crack mitigation regions 604g may prevent excessive force caused by dicing from propagating to the chips and generating cracks that extend in the chips.

Figure 7A:
FIG. 7A is a diagram for a layout of a scribe center region in accordance with one embodiment of the present disclosure.

FIG. 7A is a diagram for a layout of a scribe center region 700a in accordance with an embodiment of the present disclosure. In some embodiments, the scribe center region 700a may be the scribe center region 112 in FIGS. 1 and 2. The scribe center region 700a may include a crack guide region 702a including a crack guide structure at the center of the scribe center region 700a. The scribe center region 700a may also include crack mitigation regions 704a disposed on sides of the crack guide region 702a. In some embodiments, the crack mitigation regions 704a may include crack mitigation structures. The crack guide region 702a and the crack mitigation regions 704a may be included in any of the lines 316, 322, 328, 516, 522, 528 and/or any of the vias 320, 326, 520, 526, 536. The crack guide region 702a and the crack mitigation regions 704a may include lines that may extend parallel to a dicing line (not shown), similarly to the crack guide region 602a and the crack mitigation regions 604a, respectively. Thus, a detailed description of the lines in the crack guide region 702a and the crack mitigation regions 704a is omitted in the interest of brevity.

In some embodiments, the crack guide region 702a and the crack mitigation regions 704a may include material that has hardness greater than hardness of an insulating film including the crack guide region 702a and the crack mitigation regions 704a. The crack guide structure of the crack guide region 702a may further include a space 706a extending at the center of the crack guide region 702a. In some embodiments, the space 706a may include the dicing line. There is no line disposed in the space 706a. In some embodiments, a portion of an insulating film in the space 706a may collapse to absorb excessive force due to dicing. Thus, the crack guide region 702a including the space 706a may prevent excessive force caused by dicing from propagating to the chips and generating cracks that extend in the chips.

Figure 7B:
FIG. 7B is a diagram for a layout of a scribe center region in accordance with one embodiment of the present disclosure.

FIG. 7B is a diagram for a layout of a scribe center region 700b in accordance with an embodiment of the present disclosure. In some embodiments, the scribe center region 700b may be the scribe center region 112 in FIGS. 1 and 2. The scribe center region 700b may include a crack guide region 702b including a crack guide structure at the center of the scribe center region 700b. The scribe center region 700b may also include crack mitigation regions 704b disposed on sides of the crack guide region 702b. In some embodiments, the crack mitigation regions 704b may include crack mitigation structures. The crack guide region 702b and the crack mitigation regions 704b may be included in any of the lines 316, 322, 328, 516, 522, 528 and/or any of the vias 320, 326, 520, 526, 536. The crack guide region 702b and the crack mitigation regions 704b may include line segments that may extend parallel to a dicing line (not shown), similarly to the crack guide region 602b and the crack mitigation regions 604b, respectively. Thus, a detailed description of the line segments in the crack guide region 702b and the crack mitigation regions 704b is omitted in the interest of brevity.

In some embodiments, the crack guide region 702b and the crack mitigation regions 704b may include material that has hardness greater than hardness of an insulating film including the crack guide region 702b and the crack mitigation regions 704b. The crack guide structure of the crack guide region 702b may further include a space 706b that is similar to the space 706a of FIG. 7A. In some embodiments, a portion of an insulating film in the space 706b may collapse to absorb excessive force due to dicing. Thus, the crack guide region 702b including the space 706b may prevent excessive force caused by dicing from propagating to the chips and generating cracks that extend in the chips.

Figure 7C:
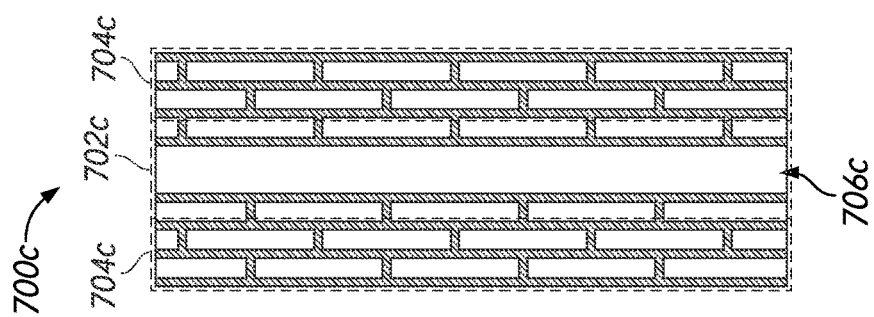
FIG. 7C is a diagram for a layout of a scribe center region in accordance with one embodiment of the present disclosure.

FIG. 7C is a diagram for a layout of a scribe center region 700c in accordance with an embodiment of the present disclosure. In some embodiments, the scribe center region 700c may be the scribe center region 112 in FIGS. 1 and 2. The scribe center region 700c may include a crack guide region 702c including a crack guide structure at the center of the scribe center region 700c. The scribe center region 700c may also include crack mitigation regions 704c disposed on sides of the crack guide region 702c. In some embodiments, the crack mitigation regions 704c may include crack mitigation structures. The crack guide region 702c and the crack mitigation regions 704c may be included in any of the lines 316, 322, 328, 516, 522, 528 and/or any of the vias 320, 326, 520, 526, 536. The crack guide region 702c and the crack mitigation regions 704c may include lines that may extend parallel to a dicing line (not shown) and line segments perpendicular to the lines in a staggered manner, similarly to the crack guide region 602c and the crack mitigation regions 604c, respectively. Thus, a detailed description of the lines and line segments in the crack guide region 702c and the crack mitigation regions 704c is omitted in the interest of brevity.

In some embodiments, the crack guide region 702c and the crack mitigation regions 704c may include material that has hardness greater than hardness of an insulating film including the crack guide region 702c and the crack mitigation regions 704c. The crack guide structure of the crack guide region 702c may further include a space 706c that is similar to the space 706a of FIG. 7A. In some embodiments, a portion of an insulating film in the space 706c may collapse to absorb excessive force due to dicing. Thus, the crack guide region 702c including the space 706c may prevent excessive force caused by dicing from propagating to the chips and generating cracks that extend in the chips.

Figure 7D:
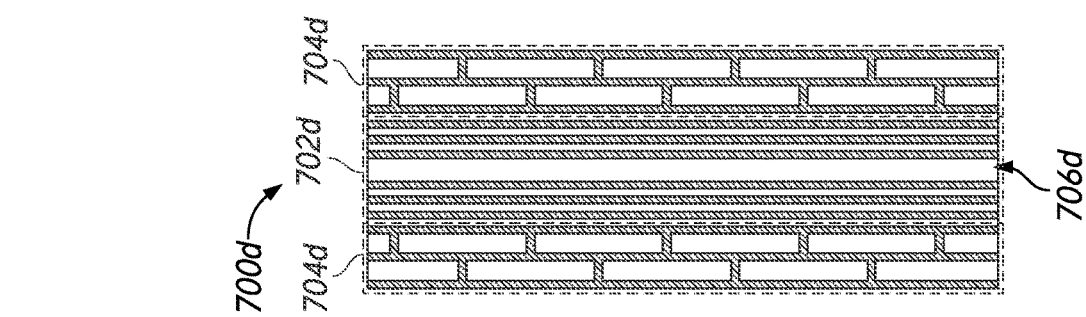
FIG. 7D is a diagram for a layout of a scribe center region in accordance with one embodiment of the present disclosure.

FIG. 7D is a diagram for a layout of a scribe center region 700d in accordance with an embodiment of the present disclosure. In some embodiments, the scribe center region 700d may be the scribe center region 112 in FIGS. 1 and 2. The scribe center region 700d may include a crack guide region 702d including a crack guide structure at the center of the scribe center region 700d. The scribe center region 700d may also include crack mitigation regions 704d disposed on sides of the crack guide region 702c. In some embodiments, the crack mitigation regions 704d may include crack mitigation structures. The crack guide region 702d and the crack mitigation regions 704d may be included in any of the lines 316, 322, 328, 516, 522, 528 and/or any of the vias 320, 326, 520, 526, 536. The crack guide region 702d may include lines that may extend parallel to a dicing line (not shown), similarly to the crack guide region 602d. The crack mitigation regions 704d may include lines that may extend parallel to a dicing line (not shown) and line segments perpendicular to the lines in a staggered manner, similarly to the crack mitigation regions 604d. Thus, a detailed description of the lines and line segments in the crack guide region 702d and the crack mitigation regions 704704d is omitted in the interest of brevity.

In some embodiments, the crack guide region 702d and the crack mitigation regions 704d may include material that has hardness greater than hardness of an insulating film including the crack guide region 702d and the crack mitigation regions 704d. The crack guide structure of the crack guide region 702d may further include a space 706d that is similar to the space 706a of FIG. 7A. In some embodiments, a portion of an insulating film in the space 706d may collapse to absorb excessive force due to dicing. Thus, the crack guide region 702d including the space 706d may prevent excessive force caused by dicing from propagating to the chips and generating cracks that extend in the chips.

Figure 7E:
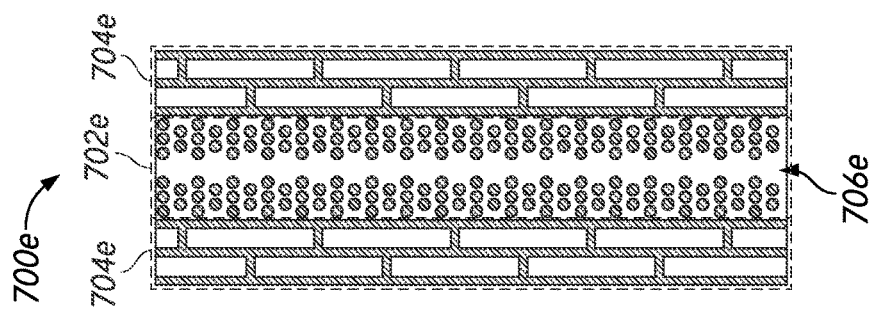
FIG. 7E is a diagram for a layout of a scribe center region in accordance with one embodiment of the present disclosure.

FIG. 7E is a diagram for a layout of a scribe center region 700e in accordance with an embodiment of the present disclosure. In some embodiments, the scribe center region 700e may be the scribe center region 112 in FIGS. 1 and 2.

The scribe center region 700e may include a crack guide region 702e including a crack guide structure at the center of the scribe center region 700e. The scribe center region 700e may also include crack mitigation regions 704e disposed on sides of the crack guide region 702e. In some embodiments, the crack mitigation regions 704e may include crack mitigation structures. The crack guide region 702e and the crack mitigation regions 704e may be included in any of the lines 316, 322, 328, 516, 522, 528 and/or any of the vias 320, 326, 520, 526, 536. The crack guide region 702e may include vias that may extend in a direction of dicing through layers perpendicular to each insulating film (e.g., the insulating films 314, 318, 324, 514, 518, 524) in a semiconductor device (e.g., the semiconductor device 100), similarly to the crack guide region 602e. The crack mitigation regions 704e may include lines that may extend parallel to a dicing line (not shown) and line segments perpendicular to the lines in a staggered manner, similarly to the crack mitigation regions 604e. Thus, a detailed description of the vias, lines and line segments in the crack guide region 702e and the crack mitigation regions 704e is omitted in the interest of brevity.

In some embodiments, the crack guide region 702e and the crack mitigation regions 704e may include material that has hardness greater than hardness of an insulating film including the crack guide region 702e and the crack mitigation regions 704e. The crack guide structure of the crack guide region 702e may further include a space 706e that is similar to the space 706a of FIG. 7A. In some embodiments, a portion of an insulating film in the space 706e may collapse to absorb excessive force due to dicing. Thus, the crack guide region 702e including the space 706e may prevent excessive force caused by dicing from propagating to the chips and generating cracks that extend in the chips.

Figure 8:
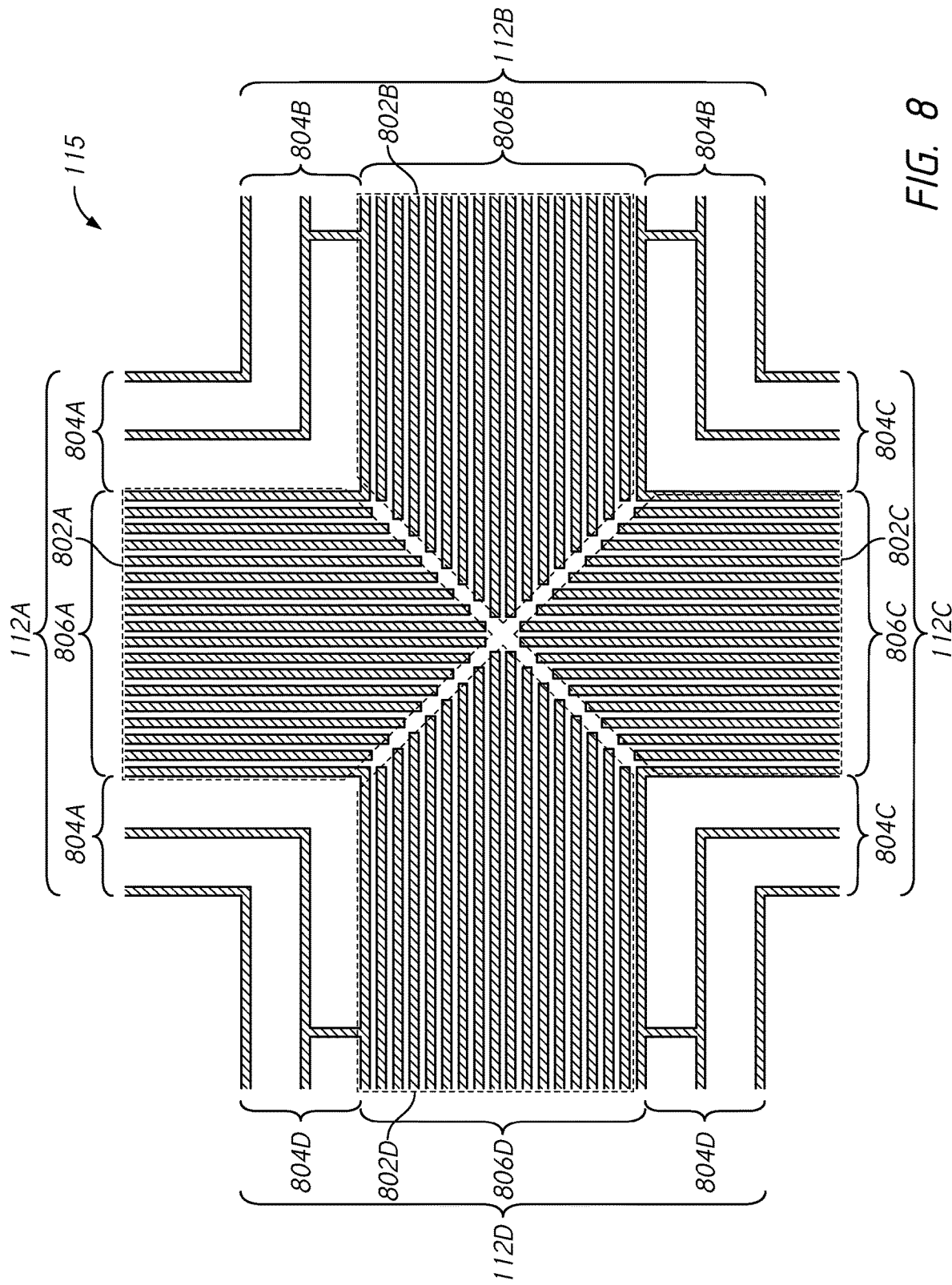
FIG. 8 is a diagram for a layout of a portion in included in a semiconductor wafer in accordance with an embodiment of the present disclosure.

FIG. 8 is a diagram for a layout of a portion 80 in a semiconductor wafer 100 in accordance with an embodiment of the present disclosure. In some embodiments, the portion 80 may be the portion 115 in FIG. 1. The portion 80 may include scribe center regions 112a-112d. The scribe center region 112a may be disposed between upper semiconductor chips 104. The scribe center region 112b may be disposed between right semiconductor chips 104. The scribe center region 112c may be disposed between lower semiconductor chips 104. The scribe center region 112d may be disposed between left semiconductor chips 104.

The scribe center region 112a may include a crack guide region 802a including a crack guide structure at the center of the scribe center region 112a. The scribe center region 112a may also include crack mitigation regions 804a disposed on sides of the crack guide region 802a. In some embodiments, the crack mitigation regions 804a may include crack mitigation structures. The crack guide region 802a and the crack mitigation regions 804a may be included in any of the lines 316, 322, 328, 516, 522, 528 and/or any of the vias 320, 326, 520, 526, 536.

The crack guide region 802a may include lines 806a that may extend parallel to a dicing line (not shown). The crack mitigation regions 804a may include lines that may extend parallel to the dicing line (not shown). In some embodiments, the crack guide region 802a and the crack mitigation regions 804a may include material that has hardness greater than hardness of an insulating film including the crack guide region 802a and the crack mitigation regions 804a.

The scribe center region 112b may include a crack guide region 802b including a crack guide structure at the center of the scribe center region 112b. The scribe center region 112b may also include crack mitigation regions 804a disposed on sides of the crack guide region 802a. In some embodiments, the crack mitigation regions 804b may include crack mitigation structures. The crack guide region 802b and the crack mitigation regions 804b may be included in any of the lines 316, 322, 328, 516, 522, 528 and/or any of the vias 320, 326, 520, 526, 536.

The crack guide region 802b may include lines 806b that may extend parallel to a dicing line (not shown). The crack mitigation regions 804b may include lines that may extend parallel to the dicing line (not shown). The crack mitigation regions 804b may also include line segments that may extend perpendicular to the lines 806b. In some embodiments, the line segments may be disposed in a staggered manner. In some embodiments, the crack guide region 802b and the crack mitigation regions 804b may include material that has hardness greater than hardness of an insulating film including the crack guide region 802b and the crack mitigation regions 804b.

The scribe center regions 112c and 112d are symmetrical to the scribe center regions 112a and 112b with respect to a center of the portion 80. Thus, a detailed description of the scribe center regions 112c and 112d is omitted in the interest of brevity.

The crack guide structure in the crack guide regions 802a-802d may guide excessive force due to dicing to propagate along the lines 806a-806d in the scribe center region 112a-112d, away from chips (e.g., the chips 104 in FIG. 1). In some embodiments, each of lines 806a-806d may be terminated at an intersection of the crack guide regions 802a-802d, without being connected to any other line of the lines 806a-806d in any other crack guide regions 802a-802d. Thus the guided force may not be propagated to any other the crack guide regions 802a-802d between other chips 104. Thus, the crack guide regions 802a-802d may prevent excessive force caused by dicing from propagating to the chips and generating cracks that extend in the chips.

By providing one or more patterns that include a crack guide structure in a scribe center region may guide excessive force due to dicing in a direction along a dicing line in a same insulating film or across insulating films. The excessive force may be guided away from adjacent chips on sides of a scribe region, and may generate cracks along the dicing line away from the adjacent chips. In some embodiments, the crack guide structure may collapse to absorb the excessive force, and thus the crack guide structure may prevent the cracks being generated. By providing one or more patterns that include crack mitigation structures in the scribe center region on sides of the pattern with the crack guide structure may prevent propagating the excessive force to the adjacent chips. As a result, cracks, even if generated by the excessive force, may be prevented from reaching the adjacent chips.

In some embodiments, patterns including crack guide structures and crack mitigation structures in a scribe center region of a semiconductor device may be formed concurrently with circuit patterns in circuit regions of the semiconductor device. Thus, forming crack guide structures and/or crack mitigation structures in the scribe center region may not increase time and cost of manufacturing the semiconductor device.

Although various embodiments have been disclosed in the present disclosure, it will be understood by those skilled in the art that the scope of the disclosure extends beyond the specifically disclosed embodiments to other alternative embodiments and/or uses and obvious modifications and equivalents thereof. In addition, other modifications which are within the scope of this disclosure will be readily apparent to those of skill in the art based on this disclosure. For example, the structure 334 in FIG. 3 and the structure in FIG. 5 described above include three layers of lines (e.g., the lines 316, 322 and 328 or the lines 516, 522 and 528) and two layers of vias between the lines (e.g, the vias 320 and 326 or the vias 520 and 526). However, a number of layers of lines and/or vias in crack guide structures and crack mitigation structures may not be limited to three and/or two; crack guide structures and crack mitigation structures may include more or less layers of lines and/or vias. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying embodiments. Thus, it is intended that the scope of at least some of the present disclosure should not be limited by the particular disclosed embodiments described above.

What is claimed is:

1. An apparatus comprising:
a first chip and a second chip;
a scribe region between the first chip and the second chip; and
a crack guide region in the scribe region, the crack guide region including a dicing line along which the first chip and the second chip are to be divided;
wherein the apparatus includes, in the crack guide region, a first set of lines in a first insulating layer, a set of vias in the first insulating layer, a second set of lines in a second insulating layer, and a third set of lines in a third insulating layer,
wherein a first end of each via in the set of vias adjoins a first line of the first set of lines and a second end of each via in the set of vias adjoins a second line of the second set of lines, and
wherein no vias adjoin the third set of lines.

2. The apparatus of claim 1, wherein the scribe region further comprises a first pad region including at least one first test terminal of the first chip and a second pad region including at least one second test terminal of the second chip, and
wherein a structure including the first set of lines, the set of vias and the second set of lines is disposed between the first and second pad regions.

3. The apparatus of claim 1, a structure including the first set of lines, the set of vias, and the second set of lines extends in a first direction parallel to the dicing line that is perpendicular to a second direction to the first chip.

4. The apparatus of claim 1, wherein the first set of lines, the set of vias, the second set of lines, or the third set of lines have a hardness greater than a hardness of the first insulating layer, the second insulating layer, or the third insulating layer.

5. The apparatus of claim 4, wherein the first insulating layer, the second insulating layer, or the third insulating layer comprises a low dielectric constant (low-k) material.

6. The apparatus of claim 4, wherein a structure including the first set of lines, the set of vias, and the second set of lines comprises metal.

7. The apparatus of claim 1, wherein a structure including the first set of lines, the set of vias, and the second set of lines extends across layers.

8. The apparatus of claim 7, wherein vias in the set of vias are connected to another pattern below the layers.

9. An apparatus comprising:
a circuit region including at least one circuit;
at least one side surface; and a circuit edge including a crack guide region extending along the side surface, wherein the crack guide region comprises a first set of lines in a first insulating layer, a set of vias in the first insulating layer, a second set of lines in a second insulating layer, and a third set of lines in a third insulating layer, wherein a first end of each via in the set of vias adjoins a first line of the first set of lines and a second end of each via in the set of vi as adjoins a second line of the second set of lines, and wherein no vias adjoin the third set of lines.

10. The apparatus of claim 9, further comprising one or more cracks along the crack guide region.

11. The apparatus of claim 10, wherein a structure including the first set of lines, the set of vias, and the second set of lines is configured to be collapsed.

12. An apparatus comprising:

a first chip and a second chip; and a scribe region including a crack guide region between the first chip and the second chip;

wherein the apparatus includes, in the crack guide region, a first set of lines in a first insulating layer, a set of vias in the first insulating layer, a second set of lines in a second insulating layer, and a third set of lines in a third insulating layer, wherein a first end of each via in the set of vias adjoins a first line of the first set of lines and a second end of each via in the set of vias adjoins a second line of the second set of lines, and wherein no vias adjoin the third set of lines.

13. The apparatus of claim 12, wherein a structure including the first set of lines, the set of vias, and the second set of lines is configured to collapse responsive to dicing.

14. The apparatus of claim 12, wherein a structure including the first set of lines, the set of vias, and the second set of lines is configured to guide a force in a dicing direction perpendicular to a, direction to the first chip.

15. The apparatus of claim 12, further comprising a crack mitigation structure at a side of a structure including the first set of lines, the set of vas, and the second set of lines, the crack mitigation structure being configured to guide a force to the center of the scribe region.

16. The apparatus of claim 15, wherein the crack mitigation structure comprises:

one or more lines extending in a dicing direction; and one or more line segments extending in a direction perpendicular to the dicing direction configured to guide a force to the center of the scribe region.

* * * * *